(12) United States Patent
Okubo

(10) Patent No.: US 8,398,214 B2
(45) Date of Patent: Mar. 19, 2013

(54) LIQUID EJECTING HEAD, LIQUID EJECTING APPARATUS, AND ACTUATOR DEVICE

(75) Inventor: Katsuhiro Okubo, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 660 days.

(21) Appl. No.: 12/392,270

(22) Filed: Feb. 25, 2009

(65) Prior Publication Data
US 2009/0213189 A1     Aug. 27, 2009

(30) Foreign Application Priority Data

Feb. 26, 2008  (JP) ................................. 2008-043936
Oct. 23, 2008  (JP) ................................. 2008-272808

(51) Int. Cl.
*B41J 2/045* (2006.01)
(52) U.S. Cl. ........................................................ 347/68
(58) Field of Classification Search ........................ None
See application file for complete search history.

(56) References Cited

U.S. PATENT DOCUMENTS

| 7,229,862 | B2 * | 6/2007 | Yamazaki et al. ............ 438/151 |
| 2009/0122121 | A1 * | 5/2009 | Kawasaki et al. ............... 347/85 |

FOREIGN PATENT DOCUMENTS

| JP | 10-044418 | 2/1998 |
| JP | 2006281477 A | * 10/2006 |

* cited by examiner

*Primary Examiner* — Matthew Luu
*Assistant Examiner* — Erica Lin
(74) *Attorney, Agent, or Firm* — Workman Nydegger

(57) ABSTRACT

There is provided a liquid ejecting head including a channel forming member in which a pressure generating chamber is provided, a piezoelectric element that is provided at one surface side of the channel forming member, a terminal portion electrically connected to the piezoelectric element; the terminal portion being provided at the one surface side of the channel forming member, a wiring substrate which has a wiring layer, and an adhesive layer for electrically connecting the wiring layer and the terminal portion and for combing the wiring substrate and the channel forming member, the adhesive layer being formed by an anisotropic conductive material. A gap layer that is electrically discontinuous with the terminal portion and the wiring layer is provided on at least one surface of the channel forming member and the wiring substrate in an area in which the adhesive layer is provided.

10 Claims, 6 Drawing Sheets

LIQUID EJECTING HEAD, LIQUID EJECTING APPARATUS, AND ACTUATOR DEVICE

BACKGROUND

1. Technical Field

The present invention relates to a liquid ejecting head, a liquid ejecting apparatus, and an actuator device for ejecting liquid from a nozzle opening, and in particular to an ink jet recording head and an ink jet type recording apparatus for ejecting ink as liquid.

2. Related Art

In an ink jet type recording head, a part of a pressure generating chamber communicated with a nozzle opening is constituted by a diaphragm, and by deforming the diaphragm by a piezoelectric element to apply a pressure to ink in the pressure generating chamber, an ink drop is ejected from the nozzle opening. The ink jet type recording head using deflective deformation of the piezoelectric element formed by a lower electrode, a piezoelectric body layer, and an upper electrode has been practically realized.

A driving circuit for supplying a driving signal for driving the piezoelectric element is mounted on a wiring substrate such as a flexible printed substrate or the like. The driving signal from the driving circuit is supplied to the piezoelectric element via the wiring substrate (for example, see JP-A-10-44418 (hereinafter, referred to as Patent document 1) page 7, FIG. 8).

The driving circuit for supplying a driving signal for driving the piezoelectric element is mounted on a wiring substrate such as a flexible printed substrate. A wiring layer of the wiring substrate and a terminal portion that is electrically connected to the piezoelectric element are electrically connected via an anisotropic conductive material, and the wiring substrate and a channel forming substrate on which the piezoelectric element is provided are combined by an anisotropic conductive material (for example, see Patent document 1)

However, when the wiring layer of the wiring substrate and the terminal portion are adhered by the anisotropic conductive material, when both of the wiring layer and the terminal portion are pressurized in the state where the anisotropic conductive material is thinly formed on the wiring substrate, there is a problem in that a gap is formed between the wiring substrate and the channel forming substrate in the area except a part between the wiring layer and terminal portion, electrical and mechanical adhesive strength between the wiring layer and the terminal portion is reduced, and disconnecting, peeling of the wiring substrate and the channel forming substrate, or the like is occurred.

Specifically, when the height of the terminal portion connected to the wiring layer from the channel forming substrate is high, a distance between the channel forming substrate and the wiring substrate between the adjacent terminal portions is increased. Accordingly, there is a tendency that a gap is formed.

Note that such a problem exists not only in an actuator device mounted in a liquid ejecting head such as an ink jet type recording head, but also in an actuator device mounted in another device in the same way.

SUMMARY

An advantage of some aspects of the invention is to provided a liquid ejecting head, a liquid ejecting apparatus, and an actuator device that improve electrical and mechanical adhesive force between a wiring substrate and an electrode while reducing the cost.

According to an aspect of the invention, there is provided a liquid ejecting head including a channel forming member in which a pressure generating chamber communicating with a nozzle opening that ejects liquid is provided, a piezoelectric element that changes a pressure in the pressure generating chamber, the piezoelectric element being provided at one surface side of the channel forming member, a terminal portion electrically connected to the piezoelectric element; the terminal portion being provided at the one surface side of the channel forming member, a wiring substrate on which a wiring layer for supplying a driving signal for driving the piezoelectric element is provided, and an adhesive layer for electrically connecting the wiring layer and the terminal portion and for combing the wiring substrate and the channel forming member, the adhesive layer being formed by an anisotropic conductive material. A gap layer that is electrically discontinuous with the terminal portion and the wiring layer is provided on at least one surface of the channel forming member and the wiring substrate in an area in which the adhesive layer is provided.

According to the aspect, the distance between the channel forming substrate and the wiring substrate in the area except the terminal portion can be narrowed. Accordingly, even when the channel forming substrate and the wiring substrate are combined by using a relatively thin anisotropic conductive material, it can be prevented that a gap is formed in the adhesive layer in the area except the terminal portion. Herewith, electrical and mechanical adhesive strength between the terminal portion and wiring layer can be improved, so that disconnecting and peeling can be prevented. Further, since the amount of the anisotropic conductive material can be reduced, the cost can be reduced.

Herein, it is preferable that the gap layer is provided on the wiring substrate. In this case, the gap layer can be easily formed with high accuracy.

Further, it is preferable that the gap layer is constituted by the same layer as the wiring layer. In this case, since the gap layer can be simultaneously formed with the wiring layer, the gap layer can be formed with high accuracy, and the cost can be reduced as compared with the case when the gap layer is formed by another material or by another process.

Further, it is preferable that a plurality of the terminal portions are aligned side by side, and the gap layer is provided between the adjacent terminal portions.

In this case, it can be prevented that a gap is formed in the adhesive layer between the adjacent terminal portions, and electrical and mechanical adhesive strength between the terminal portion and the wiring layer can be surely improved.

Further, it is preferable that the height of the terminal portion from the channel forming member is higher than the height of the piezoelectric element from the channel forming member, and the wiring substrate is provided above the piezoelectric element to form a predetermined space between the wiring substrate and the piezoelectric element. In this case, displacement lowering of the piezoelectric element due to the wiring substrate that is made contact with the piezoelectric element can be prevented.

Further, it is preferable that the height of terminal portion from a surface of the channel forming member is not less than 20 μm. In this case, the distance between the channel forming substrate and the wiring substrate in the area except the terminal portion can be narrowed. Accordingly, even when the channel forming substrate and the wiring substrate are combined by using a relatively thin anisotropic conductive material, it can be prevented that a gap is formed in the adhesive layer in an area except the terminal portion.

Further, it is preferable that a surface of the terminal portion opposite to the side of the channel forming member is a connection surface that is inclined so that the piezoelectric element side is high and the side opposite to the piezoelectric element is low with respect to a reference surface. Note that the inclined connection surface may have some irregularity as far as the connection surface is inclined as the whole. Herein, as the inclined connection surface becomes apart from the reference surface in the direction from the channel forming substrate to the terminal portion, the height of the connection surface becomes high.

In this case, by inclining the connection surface of the terminal portion, the distance between the piezoelectric element and the wiring substrate is separated. Accordingly, it can be prevented that the wiring substrate is made contact with the piezoelectric element. Further, since the height of the terminal portion can be lowered, the amount of the anisotropic conductive material can be reduced. Accordingly, it can be prevented that a gap is formed in the anisotropic conductive material. Accordingly, electric and mechanical strength can be improved.

Further, according to another aspect of the invention, there is provided a liquid ejecting apparatus including the liquid ejecting head according to the aforementioned aspect.

According to the aspect, a liquid ejecting apparatus whose reliability is improved can be provided.

Further, according to another aspect of the invention, there is provide an actuator device including a piezoelectric element provided on a substrate, a terminal portion electrically connected to the piezoelectric element; the terminal portion being provided at one surface side of the substrate, a wiring substrate on which a wiring layer for supplying a driving signal for driving the piezoelectric element is provided, and an adhesive layer for electrically connecting the wiring layer and the terminal portion and for combing the wiring substrate and the channel forming member, the adhesive layer being formed by an anisotropic conductive material. A gap layer that is electrically discontinuous with the terminal portion and the wiring layer is provided on at least one surface of the channel forming member and the wiring substrate in an area in which the adhesive layer is provided.

The distance between the substrate and the wiring substrate in the area except the terminal portion can be narrowed. Accordingly, even when the substrate and the wiring substrate are bonded by using a relatively thin anisotropic conductive material, it can be prevented that a gap is formed in the adhesive layer in the area except the terminal portion. Herewith, electrical and mechanical adhesive strength between the terminal portion and wiring layer can be improved, so that disconnecting and peeling can be prevented. Further, since the amount of the anisotropic conductive material can be reduced, the cost can be reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described in detail.

First Embodiment

Figure 1:
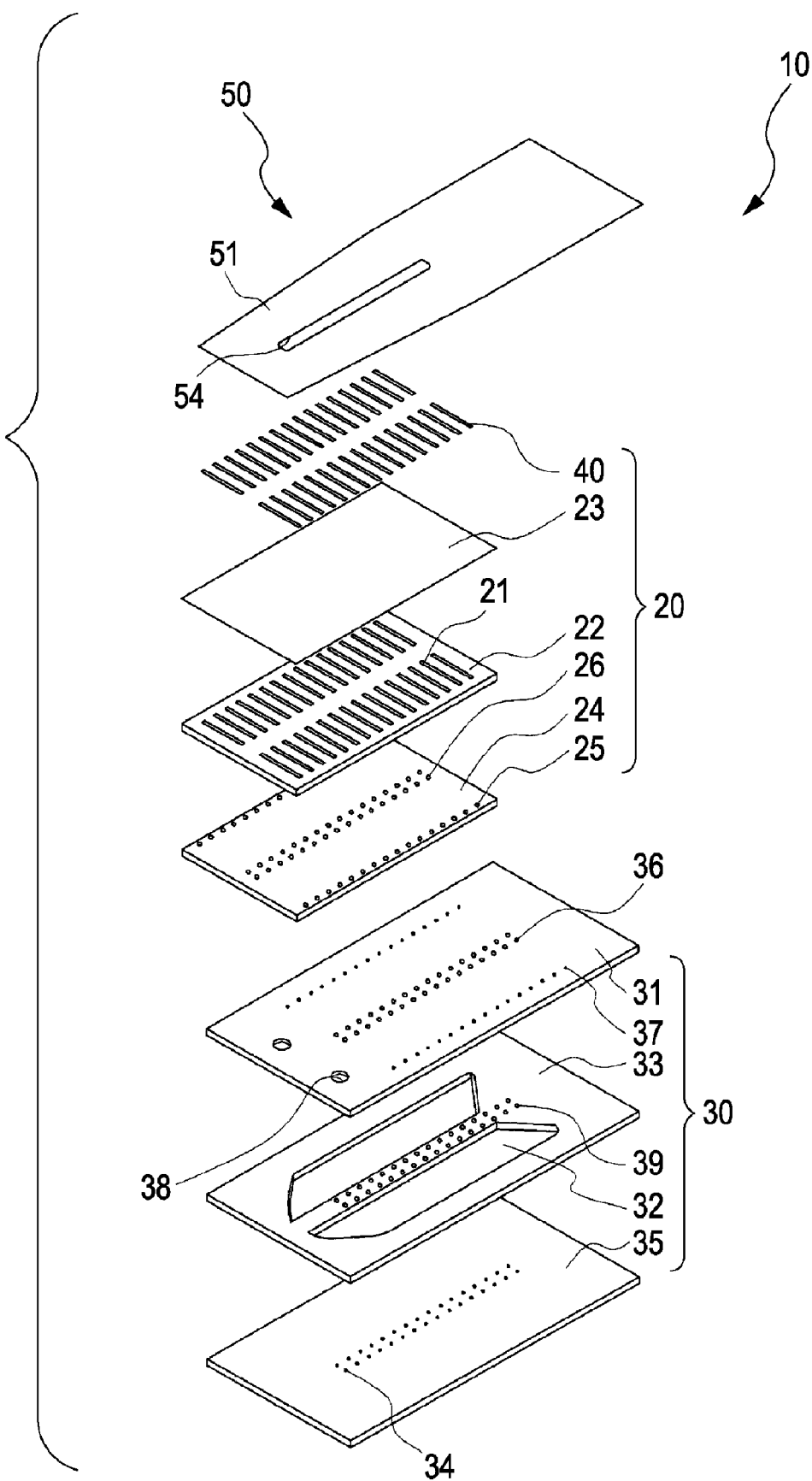
FIG. 1 is an exploded perspective view showing a recording head according to a first embodiment of the invention.
Figure 2:
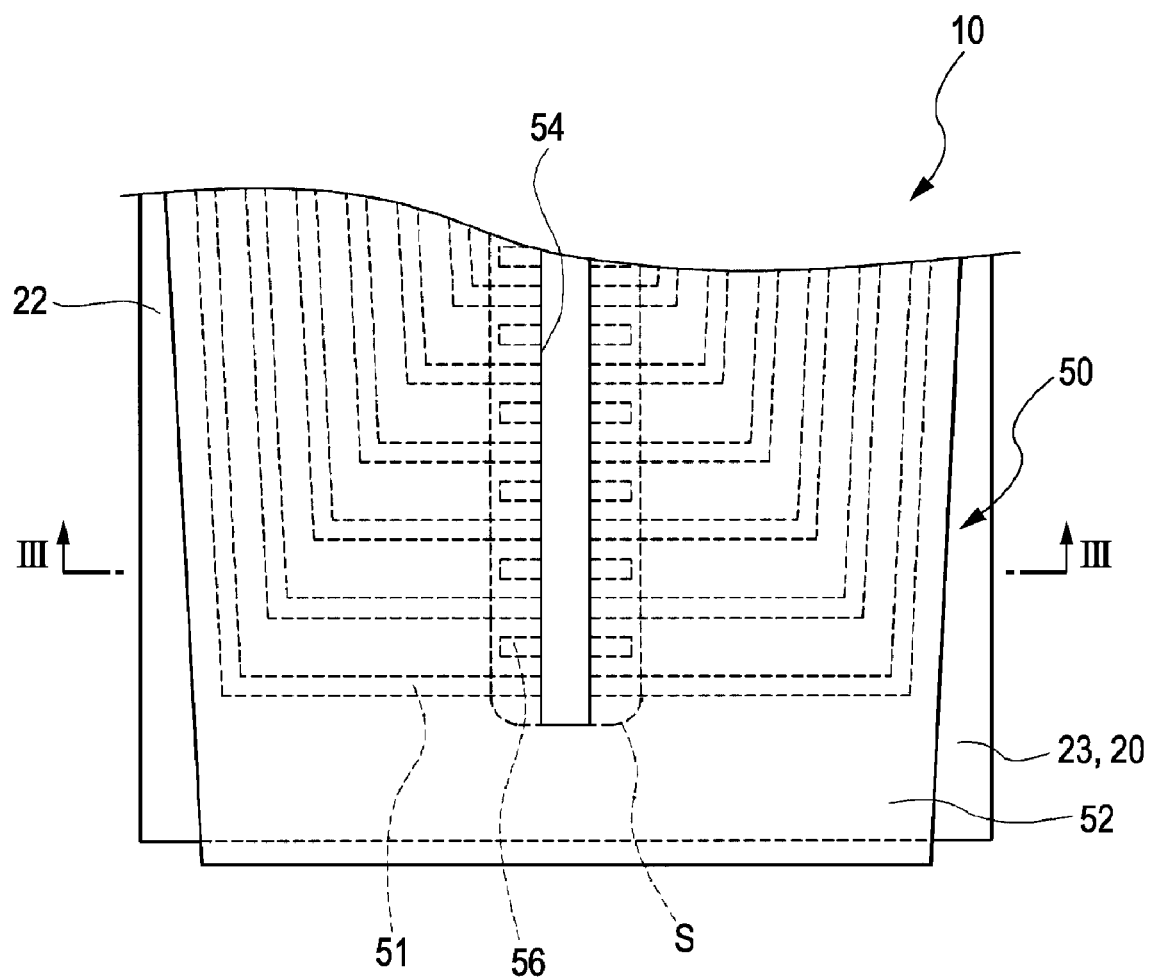
FIG. 2 is a plan view showing the recording head according to the first embodiment of the invention.
Figure 3:
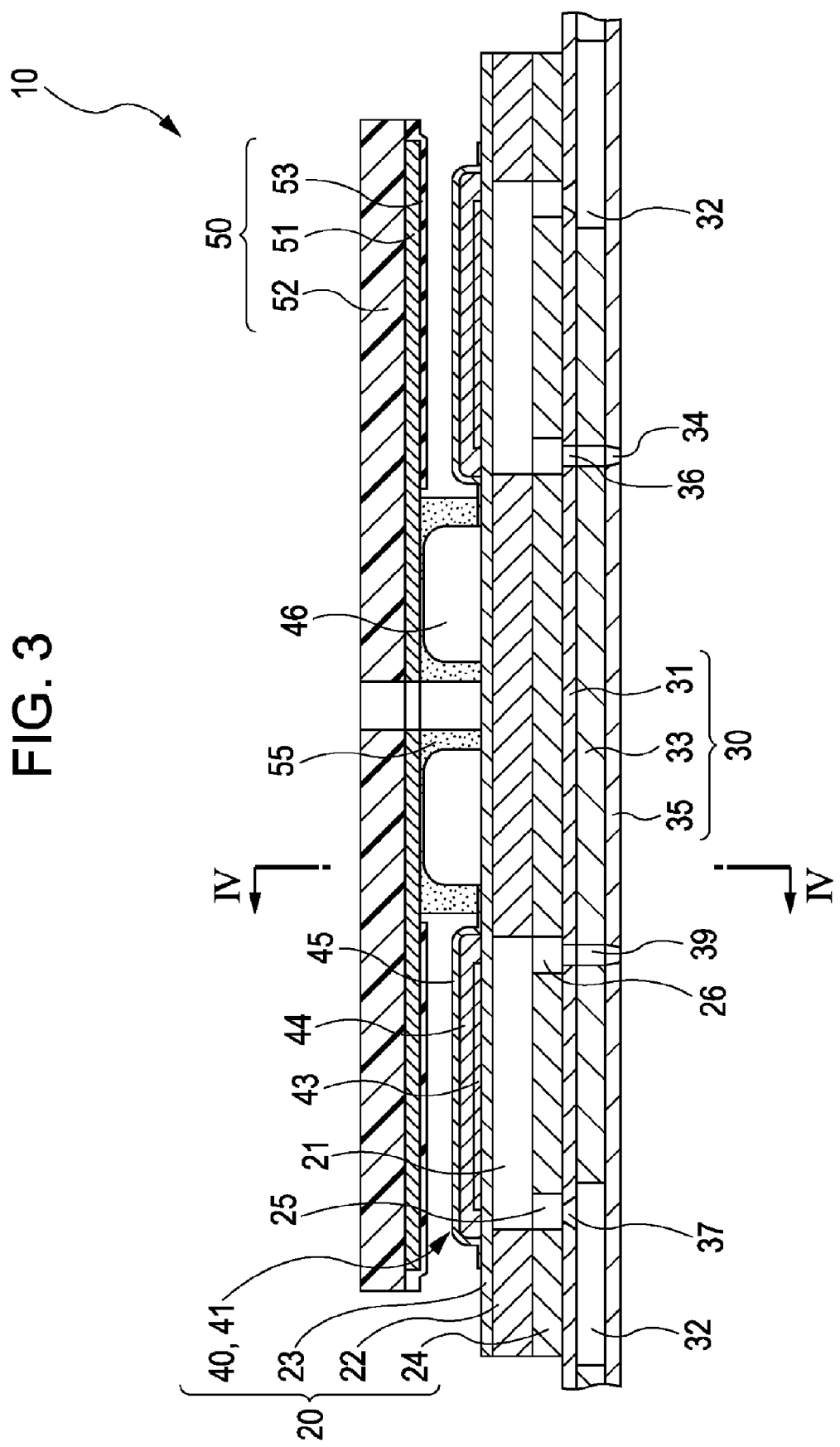
FIG. 3 is a cross sectional view showing the recording head according to the first embodiment of the invention.
Figure 4:
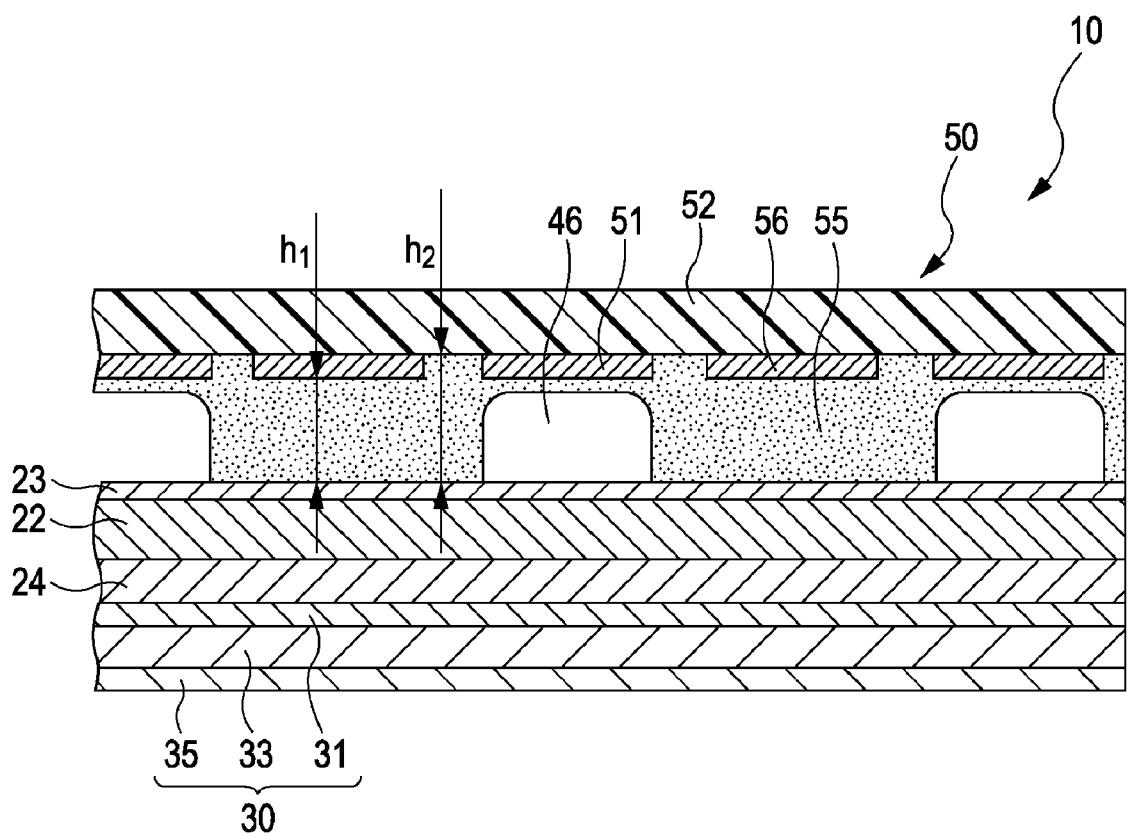
FIG. 4 is a cross sectional view showing the recording head according to the first embodiment of the invention.

FIG. 1 is an exploded perspective view showing an ink jet type recording head that is an example of a liquid ejecting head according to a first embodiment of the invention, FIG. 2 is a plan view showing the ink jet type recording head, FIG. 3 is a cross sectional view taken along the line III-III of FIG. 2, and FIG. 4 is a cross sectional view taken along the line IV-IV of FIG. 3.

As shown in the drawings, an ink jet type recording head 10 of the embodiment is constituted by an actuator unit 20, a channel unit 30 to which the actuator unit 20 is fixed, and a wiring substrate 50 connected to the actuator unit 20.

The actuator unit 20 is an actuator device equipped with a piezoelectric element 40, and includes a channel forming substrate 22 which is a channel forming member in which a pressure generating chamber 21 is formed, a diaphragm 23 provided at one surface side of the channel forming substrate 22, and a pressure generating chamber bottom plate 24 provided at the other surface side of the channel forming substrate 22.

The channel forming plate 22 is, for example, formed by a ceramic plate such as alumina ($Al_2O_3$), zirconia ($ZrO_2$), or the like having a thickness of about 150 µm, and in the embodiment, a plurality of the pressure generating chambers 21 are provided to form two rows that are aligned side by side along the width direction thereof. The diaphragm 23 formed by, for example, a thin plate made of zirconia having a thickness of 10 µm is fixed at one surface of the channel forming substrate 22, and one surface of the pressure generating chamber 21 is sealed by the diaphragm 23.

The pressure generating chamber bottom plate 24 is fixed to the other surface side of the channel forming substrate 22 and seals the other surface of the pressure generating chamber 21. The pressure generating chamber bottom plate 24 includes a supply communication hole 25 that is provided near one end of the pressure generating chamber 21 in the longitudinal direction and that makes the pressure generating chamber 21 communicated with a reservoir to be described below, and a nozzle communication hole 26 that is provided near the other end of the pressure generating chamber 21 in the longitudinal direction and that is communicated with a nozzle opening 34 to be described below.

Each of the piezoelectric element 40 is provided at the area opposing each of the pressure generating chamber 21 on the diaphragm 23. For example, in the embodiment, two lows of the pressure generating chambers 21 are provided, so that two rows of the piezoelectric elements 40 are provided.

Herein, each piezoelectric element 40 is constituted by a lower electrode film 43 provided on the diaphragm 23, a piezoelectric body layer 44 independently provided for every pressure generating chamber 21, and an upper electrode film 45 provided on each piezoelectric body layer 44. The piezoelectric body layer 44 is formed by applying a green sheet made of a piezoelectric material or printing. The lower electrode film 43 is provided over the piezoelectric body layers 44 aligned side by side and is provided as a common electrode of each piezoelectric element, and functions as a part of the diaphragm. It goes without saying that the lower electrode film 43 may be provided for every piezoelectric body layer 44.

Note that the channel forming substrate 22, the diaphragm 23, and the pressure generating chamber bottom plate 24 which constitute each layer of the actuator unit 20 are integrated without an adhesive agent by forming a clayey ceramic material, so called a green sheet, to have a predetermined thickness and, for example, by drilling the pressure generating chamber 21 and the like, and thereafter by laminating and burning the material. Then, the piezoelectric element 40 is formed on the diaphragm 23.

On the other hand, the channel unit 30 is constituted by an ink supply opening formed substrate 31 that is bonded to the pressure generating chamber bottom plate 24 of the actuator unit 20, a reservoir forming substrate 33 in which a reservoir 32 which becomes a common ink chamber for the plurality of the piezoelectric generating chambers 21 is formed, and a nozzle plate 35 in which the nozzle opening 34 is formed.

The ink supply opening formed substrate 31 is formed by a thin plate made of zirconia having a thickness of 150 μm, and is constituted by drilling a nozzle communicating hole 36 that connects the nozzle opening 34 and the pressure generating chamber 21, and an ink supply opening 37 that connects the reservoir 32 and the pressure generating chamber 21 with the aforementioned supply communication hole 25. Further, an ink introduction port 38 that is communicated with each reservoir 32 and that supplies ink from an outer ink tank is provided in the ink supply opening formed substrate 31

The reservoir forming substrate 33 is constituted by, for example, a plate material equipped with corrosion resistance such as stainless steel whose thickness is 150 μm suited for constituting an ink channel. The reservoir forming substrate 33 includes a reservoir 32 for receiving ink supplied from an outer ink tank (not shown) and for supplying the ink to the pressure generating chamber 21, and a nozzle communication hole 39 for making the pressure generating chamber 21 communicated with the nozzle opening 34.

The nozzle plate 35 is formed by, for example, drilling a thin plate made of stainless steel to form the nozzle openings 34 arranged at the pitch same as the that of the pressure generating chambers 21. For example, in the embodiment, since two rows of the pressure generating chambers 21 are provided, two rows of the nozzle openings 34 are formed also in the nozzle plate 35 in the channel unit 30. Further, the nozzle plate 35 is combined on the surface of the reservoir forming substrate 33 opposite to the channel forming substrate 22 and seals one surface of the reservoir 32.

The channel unit 30 is formed by fixing the ink supply opening formed substrate 31, the reservoir forming substrate 33, and the nozzle plate 35 with an adhesive agent, a hot welded film, or the like. Note that in the embodiment, each of the reservoir forming substrate 33 and the nozzle plate 35 is formed by stainless steal. However, the channel unit 30 may be integrally formed similarly to the actuator unit 20 by using, for example, a ceramic.

Then, the channel unit 30 and the actuator unit 20 are combined and fixed via an adhesive agent or a hot welded film.

Further, as shown in FIGS. 3, 4, a terminal portion 46 that is electrically connected to the piezoelectric element 40 is formed on the area opposing a peripheral wall of the pressure generating chamber 21 at one end of each piezoelectric element 40 in the longitudinal direction. The terminal portion 46 is provided for every piezoelectric element 40. The terminal portion 46 that is electrically connected to the upper electrode film 45, and the terminal portion 46 that is electrically connected to the lower electrode film 43 that is withdrawn to both end sides of the piezoelectric elements in the aligned direction are aligned side by side in the aligned direction of the piezoelectric element 40. In the embodiment, two rows of the terminal portions 46 that are aligned side by side between the row and the row of the piezoelectric elements 40 that are aligned side by side.

The terminal portion 46 is formed so that the height from the channel forming substrate 22 (diaphragm 23) that is, the upper end surface is higher than the height of the piezoelectric element 40 from the channel forming substrate 22 (diaphragm 23). As is described below in detail, this is to prevent that the wiring substrate 50 is made contact with the piezoelectric element 40 to lower the displacement of the piezoelectric element 40 when the terminal portion 46 and the wiring layer 51 of the wiring substrate 50 are connected. In the embodiment, the height of the terminal portion 46 from the channel forming member 22 (diaphragm 23) is set to 20 μm.

Note that the terminal 46 can be formed by, for example, a screen printing by using a metal material having a high conductive property such as silver (Ag).

Then, the wiring layer 51 provided on the wiring substrate 50 is electrically connected to the terminal portion 46 that is electrically connected to each upper electrode film 45 and the lower electrode film 43 of the piezoelectric element 40. A driving signal from a driving circuit not shown is supplied to each piezoelectric element 40 via the wiring substrate 50. Note that, as is not specifically shown in the drawings, the driving circuit may be mounted on the wiring substrate 50, or may be mounted on other than the wiring substrate 50.

One wiring substrate 50 is provided over two rows of the piezoelectric elements 40 and is formed by, for example, a flexible printing circuit (FPC), a tape carrier package (TCP), or the like. To be more specific, the wiring substrate 50 is formed by forming the wiring layer 51 having a predetermined pattern formed by subjecting tin plating or the like onto a copper thin film on the surface of the base film 52, and by covering the area of the wiring layer 51 except the edge that is connected to the terminal portion 46 with an insulating material 53 such as a resist.

Further, a through hole 54 is provided in the wiring substrate 50 in the area opposing a part between the row and the row of the piezoelectric elements 40 aligned side by side, and the wiring layer 51 is connected to at an end of the terminal portion 46 at the through hole 54 side. Note that the through hole 54 of the wiring substrate 50 is formed in the base film 52 by continuously forming the wiring layer 51 connected to one row of the piezoelectric element 40 and the wiring layer 51 connected to the other row of the piezoelectric element 40 on the surface of the base film 52 in which the through hole 54 is not provided, and thereafter cutting the electrically connected wiring layer 51 that is connected to the two rows of piezoelectric element 40.

The wiring layer 51 of the wiring substrate 50 and the terminal portion 46 that is electrically connected to the piezoelectric element 40 are electrically and mechanically connected via an adhesive layer 55 formed by an anisotropic conductive material.

Herein, the adhesive layer 55 formed by an anisotropic conductive material is provided over the pluralities of terminal portions 46 that are aligned side by side as shown in the area S of FIG. 2, and the terminal portion 46 and the wiring layer 51 are electrically are connected by the adhesive layer 55 provided between the terminal portion 46 and the wiring layer 51, and the channel forming substrate 22 and the terminal portion 46 are mechanically connected to the wiring substrate 50 and the wiring layer 51 by the adhesive layer 55 provided between the adjacent terminal portions 46.

Note that as for the anisotropic conductive material, there are included, for example, an anisotropic conductive film (ACF), an anisotropic conductive paste (ACP), and the like. Incidentally, as for the anisotropic conductive material, conventionally well know one, for example, such as an epoxy system resin, the one in which nickel is coated onto a resin ball, or the like can be used.

Further, in the embodiment, a gap layer 56 which is electrically discontinuous with the terminal portion 46 and wiring substrate 51 is provided in the area S in which the adhesive layer 55 of the wiring substrate 50 is provided. That is, the gap layer 56 is provided to oppose an area between the adjacent terminal portions 46. Note that, in the embodiment, the gap layer 56 is formed by the same layer as the wiring layer 51 and is formed to be electrically discontinuous with the wiring layer 51. Further, it is preferable that the gap layer 56 is provided in the area in which the adhesive layer 55 is provided so that the dimension becomes the maximum as far as the gap layer 56 is electrically discontinuous with the wiring layer 51.

By providing the gap layer 56, as shown in FIG. 4, the distance between the channel forming substrate 22 (diaphragm 23) and the wiring substrate 50 between the adjacent terminal portions 46 can be narrowed. That is, by providing the gap layer 56, the distance $h_2$ between the wiring substrate 50 and the channel forming substrate 22 (diaphragm 23) can be reduced to the distance $h_1$ between the gap layer 56 and the channel forming substrate 22 (diaphragm 23). Incidentally, when the height of the terminal portion 46 is 20 μm, the height of the wiring layer 51 from the base film 52 is 8 μm, and the thickness of the adhesive layer 55 between the wiring layer 51 and the terminal portion 46 is 2 to 3 μm, the distance $h_1$ between the gap layer 56 and the channel forming substrate 22 (diaphragm 23) can be made to about 22 μm whereas the distance $h_2$ between the base film 52 and the channel forming substrate 22 (diaphragm 23) is about 30 μm.

In this manner, by providing the gap layer 56, the distance between the channel forming substrate 22 (diaphragm 23) and the wiring substrate 50 between the adjacent terminal portions 46 can be narrowed. Accordingly, even when the wiring substrate 50 and the channel forming substrate 22 (terminal portion 46) is connected in the state where a relatively thin anisotropic conductive material is applied on the wiring substrate 50, it can be prevented that a gap is formed between the channel forming substrate 22 (diaphragm 23) and the wiring substrate 50 between the adjacent terminal portions 46. Herewith, lowering of electrical and mechanical adhesive strength between the wiring layer 51 and the terminal portion 46 (mechanical adhesive strength between the channel forming substrate 22 and the wiring substrate 50) due to the gap can be prevented, and a defect such as disconnecting between the wiring layer 51 and the terminal potion 46, peeling of the wiring substrate 50, or the like can be prevented. Further by using an anisotropic conductive material that is relatively thin, the cost of the anisotropic conductive material can be reduced. Further, lowering of displacement characteristic of the piezoelectric element 40 can be prevented by preventing flowing out of the anisotropic conductive material to the piezoelectric element 40 side.

Further, in the embodiment, the gap layer 56 is formed by the same layer as the wiring layer 51 and is formed to be electrically discontinuous with the wiring layer 51. Herewith, the gap layer 56 can be simultaneously formed at the time when the wiring layer 51 is formed on the base film 52 to have a predetermined pattern. Accordingly, the cost can be reduced as compared with the case when the gap layer 56 is formed by a different material and a different processing as those of the wiring layer 51.

In the ink jet type recording head 10 having the structure, ink is taken in the reservoir 32 from an ink cartridge (storage means) via the ink introduction port 38, the liquid channel is filled with the ink from the reservoir 32 to the nozzle opening 34, a recording signal from a driving circuit not shown is supplied to the piezoelectric element 40 via the wiring substrate 50, and an voltage is applied to each piezoelectric element 40 corresponding to each pressure generating chamber 21 to deflect the diaphragm 23 with the piezoelectric element 40. Herewith, the pressure in each pressure generating chamber 21 is increased and an ink drop is ejected from each nozzle opening 34.

Second Embodiment

Figure 5:
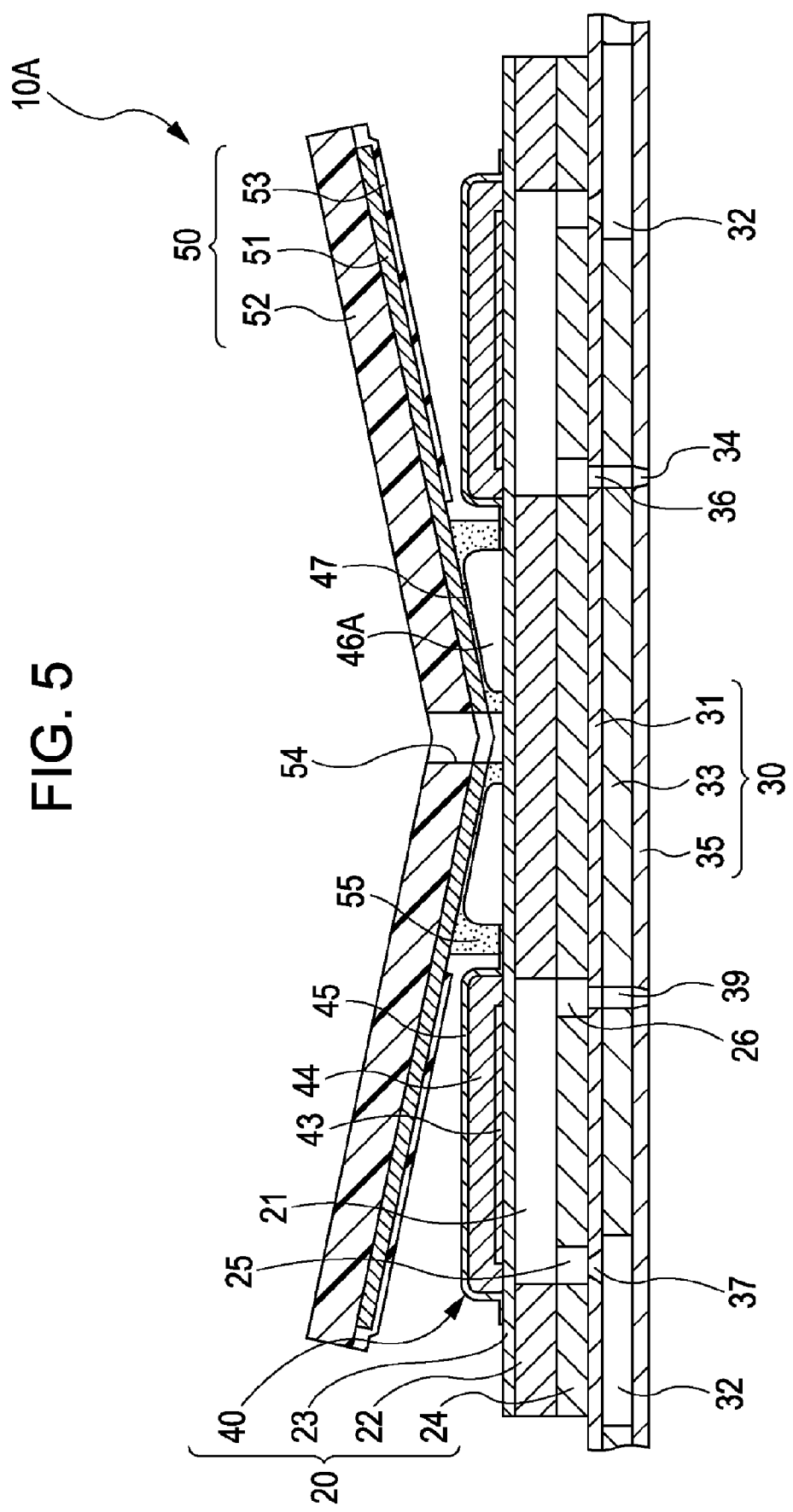
FIG. 5 is a cross sectional view showing a recording head according to a second embodiment of the invention.

FIG. 5 is a cross sectional view showing an ink jet type recording head which is an example of a liquid ejecting head according to a second embodiment of the invention. Note that, the same reference numerals are used to denote the same members as those of the first embodiment, and description thereof will be omitted.

As shown in FIG. 5, an ink jet type recording head 10A of the embodiment is equipped with a terminal potion 46A that is electrically connected to the piezoelectric element on an area opposing one end of the peripheral wall of the pressure generating camber 21 of each piezoelectric element of the channel forming substrate 22 in the longitudinal direction. The surface of the terminal portion 46A opposite to the channel forming substrate 22 (diaphragm 23) is a connection surface 47 on which the wiring layer 51 of the wiring substrate 50 is connected.

The connection surface 47 of the terminal portion is an inclined surface that is inclined so that the side of the piezoelectric element 40 is high and the side opposite to the piezoelectric element 40 is low with respect to a reference surface on which the piezoelectric element 40 of the channel forming substrate 22 is provided. That is, the connection surface 47 is an inclined surface inclining along the longitudinal direction of the pressure generating camber 21. By electrically connecting the wiring layer 51 of the wiring substrate 50 to the connection surface 47, the wiring substrate 50 is disposed in an inclined state in the direction apart from the piezoelectric element 40 along the inclined direction of the connection surface 47. Note that the reference surface of the embodiment is a surface on which the piezoelectric element 40 of the channel forming substrate 22 is provided, and specifically, the surface of the diaphragm 23 on which the piezoelectric element 40 is provided. Alternatively, the reference surface may be, for example, a surface of the channel forming substrate 22 at the diaphragm 23 side or a surface of the channel forming substrate 22 at the pressure generating chamber bottom plate 24 side. Of course, the reference surface may be a surface of a member except the channel forming substrate 22 constituting the ink jet type recording head 10A, and is not limited to only a surface of a member. Further, it is not necessary that the connection surface 47 is smooth and may have irregularity.

Herein, a gap is formed between the wiring substrate 50 and the piezoelectric element 40 by inclining the wiring substrate 50, so that it is not necessary that the height of the connection surface 47 of the terminal portion 46A at the piezoelectric element 40 side is higher than the height of the piezoelectric element 40 from the channel forming substrate 22 (diaphragm 23). That is, the highest portion of the terminal portion 46A from the channel forming substrate 22 may be appropriately adjusted in accordance with the distance between the piezoelectric element 40 and the terminal portion 46A and the height of the space between the piezoelectric element 40 and the wiring substrate 50 that depends on the inclination angle of the connection surface 47.

Note that the terminal portion 46A having the connection surface 47 can be easily formed by, for example, repeating a screen printing more than once by using, for example, a metal material having high conductivity such as silver (Ag).

As described above, the wiring layer 51 of the wiring substrate 50 and the terminal portion 46A electrically connected to the piezoelectric element 40 are mechanically and electrically connected via the adhesive layer 55 made of an anisotropic conductive material such as an anisotropic conductive film (ACF), an anisotropic conductive paste (ACP) similarly to the aforementioned first embodiment.

The aforementioned terminal portion 46A has the connection surface 47 that is inclined so that the piezoelectric element 40 side is high. Accordingly, the wiring substrate 50 connected to the connection surface 47 is disposed in an inclined state in the direction apart from the piezoelectric element 40 along the inclined direction of the connection surface 47.

In this manner, by inclining the connection surface 47 of the terminal portion 46A and connecting the connection surface 47 to the wiring substrate 50, the wiring substrate 50 is inclined in the direction so as to apart from the piezoelectric element 40. Herewith, it can be prevented that the wiring substrate 50 is made contact with the piezoelectric element 40, and displacement lowering of the piezoelectric element 40 due to the piezoelectric element 40 that is made contact with the wiring substrate 50 can be prevented. Further, it becomes not necessary to provide a leg portion that is formed by bending the wiring substrate 50, and the gap portion at the side opposite to the terminal portion 46A of the piezoelectric element 40 by inclining the wiring substrate 50 with the inclined connection surface 47 of the terminal portion 46A. Herewith, the cost of the wiring substrate 50 itself and the manufacturing cost can be reduced.

Further, by inclining the connection surface 47 of the terminal part 46A, connecting dimensions of the wiring layer 51 of the wiring substrate 50 and the connection surface 47 can be increased for sure electrical connection as compared with the case when the connection surface is level.

Further, by inclining the connection surface 47 of the terminal portion 46A, the height of the connection surface 47 of the terminal portion 46A from the channel forming substrate 22 can be relatively reduced. Herewith, the thickness of the adhesive layer 55 adhering the connection surface 47 of the terminal portion 46A and the wiring layer 51 of the wiring substrate 50 can be narrowed. That is, it is necessary to fill the adhesive layer 55 between the adjacent terminals 46A in order to mechanically connect the channel forming substrate 20 and the wiring substrate 50 similarly to the first embodiment. However, when the height of the terminal portion 46A is relatively high, the amount of the adhesive layer 55 filled between the adjacent terminal portions 46A is increased. On the other hand, the height of the terminal portion 46A is relatively lowered in the embodiment. Accordingly, the adhesive layer 55 can be fully filled between the adjacent terminal portions 46A by a small amount of adhesive agent (anisotropic conductive material). Further, the terminal portion 46A at the side opposite to the piezoelectric element 40 side is formed to have a thin thickness by inclining the connection surface 47 of the terminal portion 46A. Herewith, the adhesive layer 55 can be also sufficiently filled between the adjacent terminal portions 46A with a small amount of adhesive agent (anisotropic conductive material). In this manner, by connecting the wiring substrate 50 and the channel forming substrate 22 (terminal portion 46A) with a relatively small amount of adhesive agent, the cost can be reduced. Further, even when the wiring substrate 50 and the channel forming substrate 22 (diaphragm 23) are connected in the state where the distance between the channel forming substrate 22 (diaphragm 23) and the wiring substrate 50 between the adjacent terminal portions 46A is narrowed and a relatively thin anisotropic conductive material is applied on the wiring substrate 50, it can be prevented that a gap is formed between the channel forming substrate 22 (diaphragm 23) and the wiring substrate 50 between the adjacent terminal portions 46A. Herewith, lowering of electrical and mechanical adhesive strength between the wiring layer 51 and the terminal 46A (adhesive strength between the channel forming substrate 22 and the wiring substrate 50) due to a gap can be prevented, and a defect such as disconnection between the wiring layer 51 and the terminal portion 46A, peeling of the wiring substrate 50, or the like can be prevented. In addition, flown out of an extra anisotropic conductive material to the piezoelectric element 40 side can be prevented and lowering of displacement characteristic of the piezoelectric element 40 can be prevented.

Since the gap layer 56 is provided between the adjacent terminal portions 46 also in the embodiment similarly to the aforementioned first embodiment, the distance between the channel forming substrate 22 (diaphragm 23) and wiring substrate 50 between the adjacent terminal portions 46A can also be narrowed also by the gap layer 56. Accordingly, it can be prevented that mechanical adhesive strength between the wiring layer 51 and the terminal 46A (mechanical adhesive strength between the channel forming substrate 22 and the wiring substrate 50) is lowered by preventing that a gap is formed, and a defect such as disconnection between the wiring layer 51 and the terminal portion 46A, peeling of the wiring substrate 50, or the like can be prevented.

Other Embodiments

Each embodiment of the invention is described above. However, the basic structure of the invention is not limited to the aforementioned embodiments. For example, in the first and second embodiments, the gap layer 56 is constituted by the same layer as the wiring layer 51. However, this is not particularly limited. What is essential is that the tap layer is provided on at least one surface of the channel forming substrate 22 (diaphragm 23) and the wiring substrate 50 in the area in which the adhesive layer 55 is provided. That is, the gap layer may be provided between the adjacent terminal portions 46 or 46A at the channel forming substrate 22 (diaphragm 23) side, or the gap layer may be provided at both of the channel forming substrate 22 side and the wiring substrate 50 side. Incidentally, when the gap layer is provided at the channel forming substrate 22 side, by providing the gap layer so as to be the same layer as the terminal portion 46 or 46A and so as to be electrically discontinuous with the terminal portion 46 or 46A, the gap layer can be formed with the same material as the terminal portion 46 or 46A at the same time and the cost can be reduced. Further, in the first embodiment, the gap layer 56 that is formed by the same layer as the wiring layer 51 is exemplified. However, since the gap layer 56 is provided for narrowing the distance between the channel forming substrate 22 and the wiring substrate 50, the gap layer 56 may be formed by the insulating material 53 such as a resist constituting the wiring substrate 50 or another material. It goes without saying that the gap layer 56 may be formed by a material that is different from the terminal portion 46 or 46A even when the gap layer is provided on the channel forming substrate 20.

Further, in the first and second embodiments, as the wiring substrate 50, a structure in which the through hole 54 is provided in the base film 52 is exemplified. For example, when the adhesive layer 55 is provided also between the row and the row of the terminal portions 46 or 46A that are aligned side by side by using a wiring substrate in which the through hole 54 is not provided, the gap layer 56 may also be provided between the row and the row of the terminal portions 46 or 46A that are aligned side by side. That is, when the gap layer 56 is provided in the area in which the adhesive layer 55 is provided so that the dimensions becomes the maximum and so as to be electrically discontinuous with the wiring layer 51, it can be further prevented that a gap is formed, and electrical and mechanical adhesive strength can be improved. Incidentally, in such a case, the gap layer 56 of each row of the terminal portions 46 or 46A may be continuously provided or may be discontinuously provided.

Further, in the first and second embodiments, the actuator device using the piezoelectric element 40 of a pressure membrane type is exemplified. However, this is not specifically limited. For example, a piezoelectric element of a thin film type in which a lower electrode, a piezoelectric body layer, and an upper electrode are sequentially laminated by a film formation and a lithography method, or a piezoelectric element of a vertically vibration type in which a piezoelectric material and an electrode forming material are alternatively laminated so as to be elongated and contracted in the axis direction may be used. Note that the invention provides an excellent effect when the height of the terminal portion 46 or 46A that is electrically connected to the piezoelectric element 40 that is electrically connected to the wiring layer 51 of the wiring substrate 50 is not less than 20 μm. However, the invention is valid also in the case where the height of the terminal portion 46 or 46A is less than 20 μm.

Further, in the aforementioned first embodiment, the structure is exemplified in which the wiring layer 51 of the wiring substrate 50 is connected to the terminal portion 46 or 46A that is electrically connected to the electrode films 43, 45 of the piezoelectric element 40 by the adhesive layer 55 made of an anisotropic conductive material. However, this is not limited and the wiring layer 51 of the wiring substrate 50 may be directly connected to the upper electrode film 45 of the piezoelectric element 40. That is, the terminal portion electrically connected to the piezoelectric element 40 may be the electrode constituting the piezoelectric element 40. Also in the case, by providing the gap layer, the effect similar to that of the first embodiment can be obtained.

Further, the channel structure and the like are not limited to the embodiments, and various structures may be employed. For example, a discrete material may be provided between the terminal portion 46 and the diaphragm 23, and the channel forming substrate, the diaphragm 23, and the discrete material may be regarded as the channel forming member.

Figure 6:
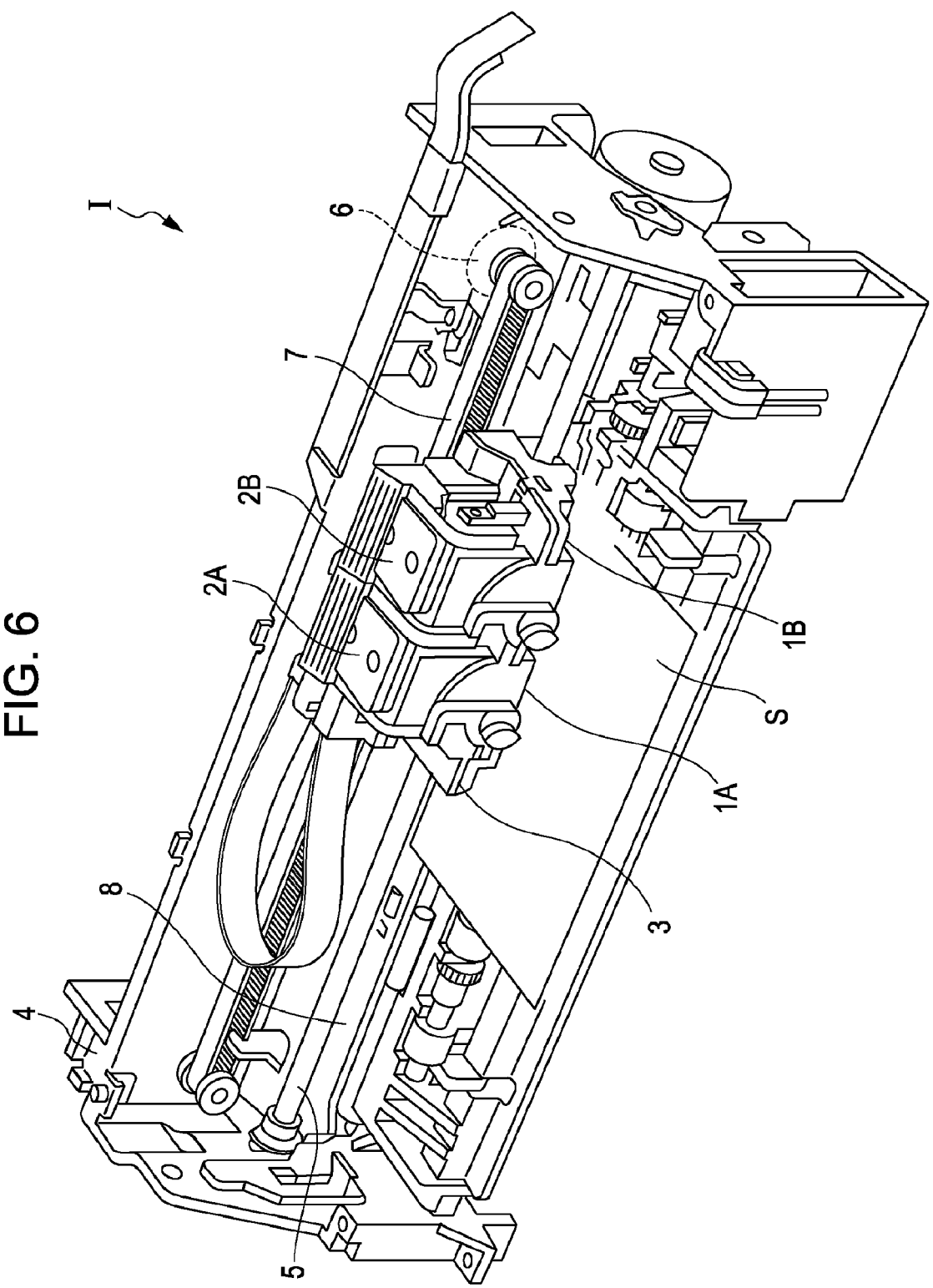
FIG. 6 is a diagram schematically showing an ink jet type recording apparatus according to the first embodiment of the invention.

Further, in the embodiments, the ink jet type recording head of the embodiments constitute a part of a recording head unit equipped with an ink channel communicated with an ink cartridge or the like, and is mounted in an ink jet type recording apparatus. FIG. 6 is a diagram schematically showing an example of the ink jet type recording apparatus.

As shown in FIG. 6, cartridges 2A and 2B constituting ink supply means are detachably provided on recording head units 1A and 1B having the ink jet type recording head. A carriage 3 on which the recording heads 1A and 1B are mounted is provided on a carriage axis 5 attached in a device main body 4 so as to be able to be moved in the axis direction. The recording head 1A and 1B shall respectively eject a black ink composition and a color ink composition.

Then, the carriage 3 mounting the recording head units 1A and 1B is moved along the carriage axis 5 by transmitting a driving force of a driving motor 6 via a plurality of gears not shown and a timing belt 7. On the other hand, a platen 8 is provided in the device main body 4 along the carriage axis 5, and a recording sheet S which is a recording medium such as a paper supplied by a paper supply roller not shown is to be wound around the platen 8 to be transported.

Note that in the first embodiment, the ink jet type recording head is employed as an example of a liquid ejecting head. However the invention may be applied to all sorts of liquid ejecting heads, and it goes without saying that the invention may be applied to a liquid ejecting head that ejects liquid except ink. As for another liquid ejecting head, for example, there are included various recording heads used in an image forming device such as a printer, a color material ejection head used for manufacturing a color filter of a liquid crystal display or the like, an electrode material ejecting head used for forming an electrode of an organic EL display, an FED (field emission display), and the like, a living organic material ejection head used for manufacturing a biochip, and the like.

Further, the invention can be applied not only to an actuator device mounted in a liquid ejecting head represented by an ink jet type recording head, but also to an actuator device mounted in another device.

The entire disclosure of Japanese Patent Application No. 2008-043936, filed Feb. 26, 2008 is incorporated by reference herein.

The entire disclosure of Japanese Patent Application No. 2008-272808, filed Oct. 23, 2008 is incorporated by reference herein.

What is claimed is:

1. A liquid ejecting head comprising:
   a channel forming member in which a pressure generating chamber communicating with a nozzle opening that ejects liquid is provided;
   a piezoelectric element that changes a pressure in the pressure generating chamber, the piezoelectric element being provided at one surface side of the channel forming member;
   a terminal portion electrically connected to the piezoelectric element, the terminal portion being provided at the one surface side of the channel forming member;
   a wiring substrate on which a wiring layer for supplying a driving signal for driving the piezoelectric element is provided; and
   an adhesive layer for electrically connecting the wiring layer and the terminal portion and for combining the wiring substrate and the channel forming member, the adhesive layer being formed by an anisotropic conductive material, wherein
   a gap layer that is electrically discontinuous with the terminal portion and the wiring layer, the gap layer being provided on at least one surface of the channel forming member and the wiring substrate in an area in which the adhesive layer is provided, the gap layer protruding from at least one surface of the wiring substrate to the adhesive layer and being placed at least between the terminal portion and an adjacent terminal portion.

2. The liquid ejecting head according to claim 1, wherein the gap layer is provided on the wiring substrate.

3. The liquid ejecting head according to claim 1, wherein the gap layer is constituted by the same layer as the wiring layer.

4. The liquid ejecting head according to claim 1, wherein a plurality of the terminal portions are aligned side by side, and the gap layer is provided between the adjacent terminal portions.

5. The liquid ejecting head according to claim 1, wherein the height of the terminal portion from the channel forming member is higher than the height of the piezoelectric element from the channel forming member, and the wiring substrate is provided above the piezoelectric element to form a predetermined space between the wiring substrate and the piezoelectric element.

6. The liquid ejecting head according to claim 1, wherein the height of terminal portion from a surface of the channel forming member is not less than 20 μm.

7. The liquid ejecting head according to claim 1, wherein a surface of the terminal portion opposite to the side of the channel forming member is a connection surface that is inclined so that the piezoelectric element side is high and the side opposite to the piezoelectric element is low with respect to a reference surface.

8. A liquid ejecting apparatus comprising the liquid ejecting head according to claim 1.

9. An actuator device comprising:
a piezoelectric element provided on a substrate including a channel forming member;
a terminal portion electrically connected to the piezoelectric element, the terminal portion being provided at one surface side of the substrate;
a wiring substrate on which a wiring layer for supplying a driving signal for driving the piezoelectric element is provided; and
an adhesive layer for electrically connecting the wiring layer and the terminal portion and for combining the wiring substrate and the channel forming member, the adhesive layer being formed by an anisotropic conductive material, wherein
a gap layer that is electrically discontinuous with the terminal portion and the wiring layer, the gap layer being provided on at least one surface of the channel forming member and the wiring substrate in an area in which the adhesive layer is provided, the gap layer protruding from at least one surface of the wiring substrate to the adhesive layer and placed at least between the terminal portion and an adjacent terminal portion.

10. The liquid ejecting apparatus according to claim 1, wherein the adhesive layer in an area in which the gap layer is provided is narrower than the adhesive layer in an area in which the gap layer and the terminal portion are not provided.

* * * * *